United States Patent [19]
Miyazawa et al.

[11] Patent Number: 6,037,793
[45] Date of Patent: Mar. 14, 2000

[54] INSPECTING METHOD AND APPARATUS FOR SEMICONDUCTOR INTEGRATED CIRCUIT

[75] Inventors: Toshio Miyazawa, Kofu; Masataka Hatta; Masahiko Akiyama, both of Yamanashi-ken, all of Japan

[73] Assignee: Tokyo Electron Limited, Tokyo, Japan

[21] Appl. No.: 09/015,065

[22] Filed: Jan. 28, 1998

[30] Foreign Application Priority Data

Jan. 30, 1997 [JP] Japan .................................. 9-031146

[51] Int. Cl.$^7$ .............................. G01R 1/02; H01L 21/66
[52] U.S. Cl. ......................... 324/760; 324/758; 324/72.5
[58] Field of Search ................................... 324/760, 758, 324/765, 158.1, 72.5

[56] References Cited

U.S. PATENT DOCUMENTS

| | | | |
|---|---|---|---|
| 4,757,255 | 7/1988 | Margozzi ................................ | 324/760 |
| 4,786,867 | 11/1988 | Yamatsu .................................. | 324/758 |
| 5,084,671 | 1/1992 | Miyata et al. ........................... | 324/760 |
| 5,410,259 | 4/1995 | Fujihara et al. ........................ | 324/758 |

FOREIGN PATENT DOCUMENTS

59-50942   12/1984   Japan .

*Primary Examiner*—Josie Ballato
*Assistant Examiner*—Minh Tang
*Attorney, Agent, or Firm*—Oblon, Spivak, McClelland, Maier & Neustadt, P.C.

[57] ABSTRACT

According to the present invention, a main chuck, on which a wafer having a number of devices is held, is driven under the control of a computer, and the devices on the wafer are brought into electric contact with the probes arranged on the upper side of the main chuck. On the basis of outputs from the probes, a tester sequentially measures the electric characteristics of the devices. When a heat-generating type device is measured, the inspecting method and apparatus of the present invention execute the following steps step of predicting the temperature of the device under measurement on the basis of the amount of heat generated from the device under measurement, step of predicting the temperatures of the devices that surround the device under measurement, step of selecting next-measurement devices (which are suitable for next measurement in light of their temperatures) from among the devices the temperatures of which are predicted in step, and calculating the position coordinates of the next-measurement devices, and a step of repeating the steps with respect to each of the devices, adding the distance between the device under measurement and the next-measurement device to the already-calculated distance, and selecting the shortest measurement route along which all devices are measured.

24 Claims, 7 Drawing Sheets

INSPECTING METHOD AND APPARATUS FOR SEMICONDUCTOR INTEGRATED CIRCUIT

BACKGROUND OF THE INVENTION

The present invention relates to a method and apparatus for inspecting the electric characteristics of a large number of semiconductor integrated circuits (hereinafter referred to simply as devices) that are formed on a semiconductor wafer (hereinafter referred to as a wafer).

As an example of this type of inspecting apparatus, reference will be made to an apparatus that comprises: a cassette mount section on which wafers are mounted in units of one cassette; a fork or forks for conveying the wafers from the cassette mount section to a loader section; a loader section from which the wafers are conveyed to a prober section; a prober section for measuring the electric characteristics of the devices of the wafers conveyed from the loader section; and a test section for inspecting the devices on the basis of the measurement results obtained in the prober section. In the loader section, a subchuck for pre-alignment is arranged, which aligns the wafers with one another by utilization of the orientation flats of the wafers when the wafers are conveyed by the fork. In the prober section, a main chuck, an alignment mechanism and a probe card are arranged. The main chuck is movable in the X-, Y-, Z- and θ-directions, and the wafers are mounted thereon, for measurement. The alignment mechanism positions the wafers on the susceptor with high accuracy. The probe card has contact elements (e.g., probes) which are brought into electric contact with the electrode pads of the devices of the wafers that have been positioned, and which output measurement results to the test section.

A test head provided with a tester is arranged in the test section. The tester is electrically connected to the contact elements of the probe card fitted on the head plate of the prober section, and electric signals are exchanged between the tester and the contact elements of the probe card, so as to measure the electric characteristics of the devices.

In the case where the electric characteristics of the devices that are arranged on a wafer in a matrix pattern are sequentially measured, the main chuck is index-fed according to a predetermined program. By this index feed, the devices arranged in the first row of the matrix pattern are sequentially measured. After the devices in the first row are measured, the devices arranged in the second row are measured in the direction opposite to that of the devices of the first row. This sequential measurement is repeated until the devices arranged in the last row are measured.

In the sequential measurement mentioned above, the devices on a wafer are inspected one by one. Needless to say, however, the devices may be inspected in groups of a predetermined number.

Figure 6A:
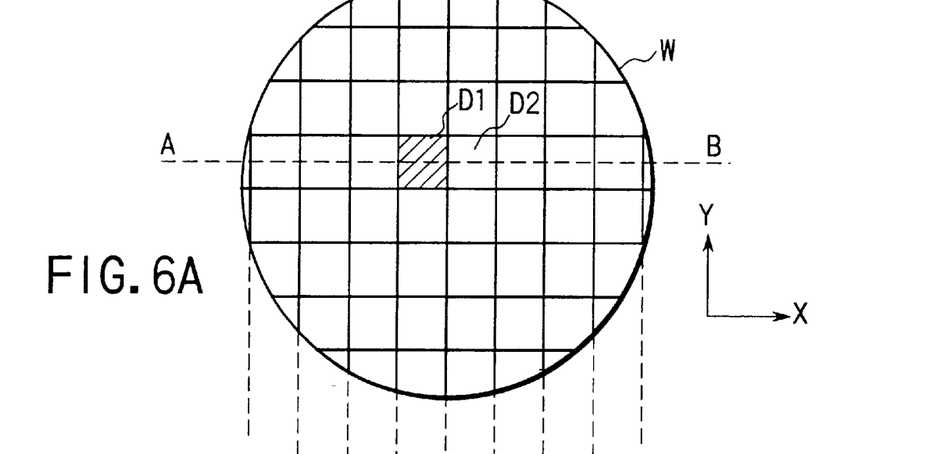
FIG. 6A is a schematic view of a wafer and illustrates the relationships between the device under measurement and the neighboring devices.
Figure 6B:
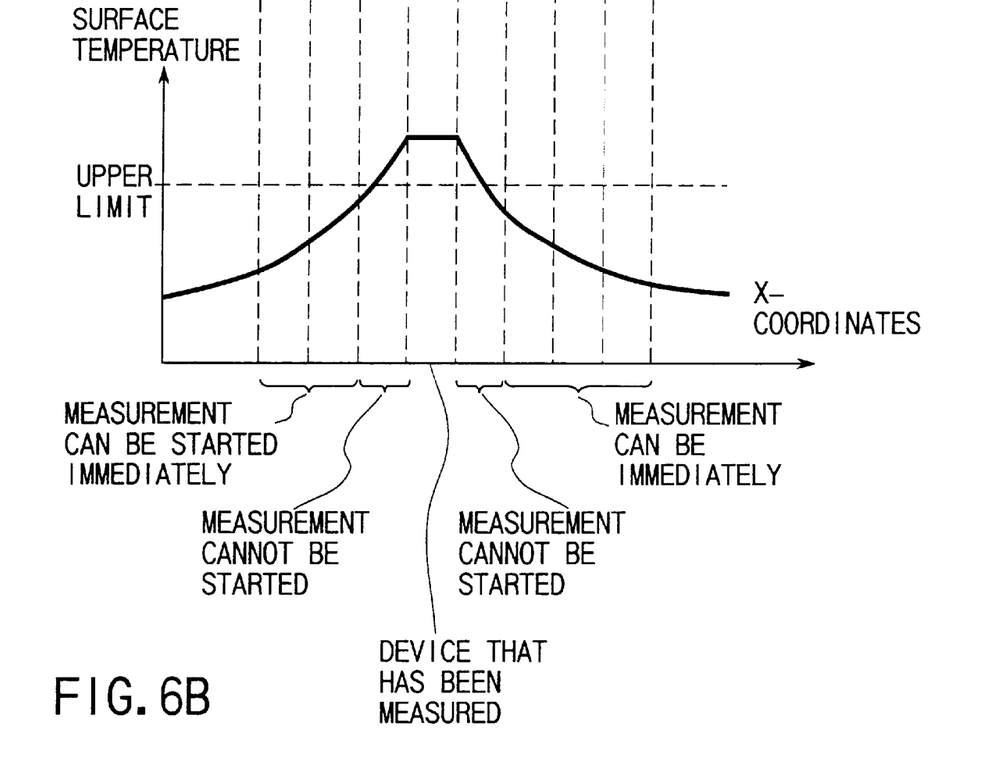
FIG. 6B is a graph showing how the temperature of the device under measurement and those of the neighboring devices vary during measurement.
Figure 7A:
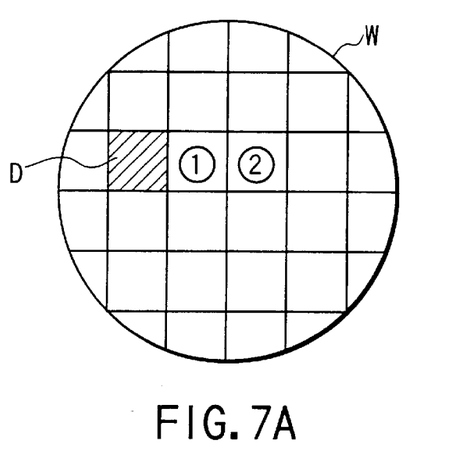
FIG. 7A shows the positional relationships between the device under measurement and the neighboring devices.
Figure 7B:
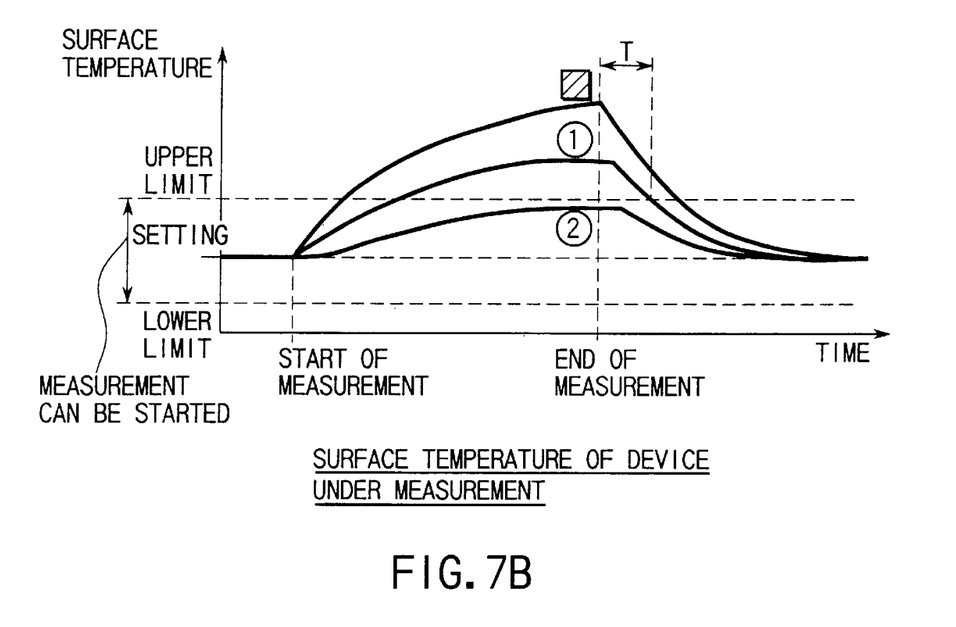
FIG. 7B is a graph showing how the temperature distribution is, immediately after the measurement of the device has been performed.

With reference to FIG. 6, a description will be given of a case where a heat-generating device D1, such as a logic element or another type of active element, is measured by the conventional inspecting apparatus. In this case, the device D1 generates heat when it is being measured. The heat from the device D1 is transmitted to the neighboring devices, with the result that the temperatures of the neighboring devices increase and become higher than the upper limit of the measurement start temperature range in which the measurement can be started. For this reason, the neighboring devices cannot be measured immediately after the measurement of the device D1. In other words, the neighboring devices must be measured after the temperatures thereof decrease to a temperature within the measurement start temperature range. This phenomenon will be described in more detail with reference to FIGS. 7A and 7B. After the measurement of device D shown in FIG. 7A is started, its temperature increases gradually, as shown in FIG. 7B. Simultaneous with this, the temperatures of devices ① and ② in the neighborhood of device D also increase. When the measurement of device D ends, the temperature of device ① is higher than the upper limit of the measurement start temperature range. Therefore, measurement of device ① cannot be started immediately after the end of the measurement of device ①. A certain time T is required before the wafer W is cooled by a cooling apparatus and the temperature of device ① falls to a temperature within the measurement start temperature range. This time T is a loss time when measurement of device ① cannot be measured. If such a loss time T is required after the measurement of each device, the total loss time will be very long before the end of the measurement of all devices, and the inspection efficiency is degraded.

BRIEF SUMMARY OF THE INVENTION

The present invention has been conceived in an effort to solve the problem mentioned above, and the object of the invention is to provide an inspecting method and apparatus which permit a device to be measured reliably and efficiently and thereby realize a remarkably enhanced inspecting efficiency and which permit even a heat-generating device to be measured reliably and efficiently with no need to wait for the surrounding devices to cool down.

The term "heat-generating device" used herein is intended to refer to a device which, when its electric characteristics are measured, generates heat in such an amount as increases the temperatures of the surrounding devices to values higher than the upper limit of the measurement start temperature range. In short, the heat-generating device is not limited an active element mentioned above.

According to one aspect of this invention there is provided a device inspecting method that comprises: a contact step of bringing contact elements into contact with the electrodes of at least one device selected from the devices that are formed on a semiconductor wafer and of causing measurement results to be output from the contact elements; and an inspecting step of measuring the electric characteristics of the selected at least one device on the basis of the measurement results output from the contact elements, the contact step and the inspecting step being sequentially executed with respect to each of the devices formed on the semiconductor wafer, the contact step including a sub-step of selecting at least one device which remains unchecked and satisfies predetermined temperature conditions from among the devices formed on the semiconductor wafer and a sub-step of bringing the contact elements into contact with the electrodes of the selected at least one device.

In each of the inventions described in the claims, the contact elements are parts that are used for measuring the electric characteristics of a device under measurement. They are brought into contact with the electrodes of the device and enable connection between the electrodes and the test circuit. Although probe needles is preferred as such parts, projected contact elements such as bumps may be used instead. That is, contact elements of any type may be used as long as they attain the intended function.

In each of the inventions described in the claims, the electric characteristics of each device are measured during the inspection, and the inspection includes measurement at ordinary temperature, measurement at a temperature higher than ordinary temperature, measurement at a temperature lower than temperature, or any combination of these.

In each of the inventions described in the claims, the temperature conditions for the inspection are specifically a temperature or a temperature range from which the measurement or inspection of a device is started.

In each of the inventions described in the claims, devices that satisfy the predetermined temperature conditions can be selected in any arbitrary way as long as such devices can be identified or designated. In a preferred embodiment, the temperatures of the devices located around the device under measurement are predicted, and those devices which satisfy the predetermined temperature condition are selected based on the predicted temperatures. Instead of this manner for selection, the temperatures of devices may be measured actually. To be specific, each time the measurement of a device is completed, the temperatures of the devices surrounding that device are actually measured. Based on this measurement, those devices which satisfy the predetermined temperature conditions are selected. Further, each time the measurement of a device is completed, the temperatures of the devices located on a predetermined route may be sequentially measured. Among those devices, the device that satisfies the predetermined temperature conditions first of all may be selected. In each of these manners for selection, the temperatures of the surrounding or next devices are measured immediately after the measurement of a given device. Needless to say, however, the temperatures need not be measured immediately; they may be measured shortly after the end of the measurement of the given device.

In the contact step, the devices formed on the semiconductor wafer maybe checked to select those devices which are not inspected and satisfy the predetermined temperature conditions. The contact elements are brought into contact with the electrodes of at least one device included among the selected devices.

According to another aspect of this invention there is provided a device inspecting method that comprises: a contact step of bringing contact elements into contact with the electrodes of one device selected from the devices that are formed on a semiconductor wafer and of causing measurement results to be output from the contact elements; and an inspecting step of measuring the electric characteristics of the selected at least one device on the basis of the measurement results output from the contact elements, the contact step and the inspecting step being sequentially executed with respect to each of the devices formed on the semiconductor wafer, the contact step including a sub-step of selecting one device which remains unchecked and satisfies predetermined temperature conditions from among the devices formed on the semiconductor wafer and a sub-step of bringing the contact elements into contact with the electrodes of the selected device.

In the contact step, the devices formed on the semiconductor wafer maybe checked to select those devices which are not inspected and satisfy the predetermined temperature conditions. The contact elements are brought into contact with the electrodes of one device included among the selected devices.

The device inspecting method further may comprise a cooling step. In this cooling step, the devices are cooled to a temperature lower than ordinary temperature.

The device inspecting method further may comprise a temperature predicting step. In this step, the temperatures of the devices formed on the semiconductor wafer are predicted at the end of the inspecting step. Based on this temperature prediction, those devices which are not inspected and satisfy the predetermined temperature conditions are selected. The contact elements are brought into contact with the electrodes of at least one device included among the selected devices.

In each of the inventions of the claims, any temperature predicting method can be used as long as it can predict the temperatures of the neighboring devices that are located around the device under measurement. For example, the temperatures of the neighboring devices may be predicted by simulating them on the basis of simulation factors, which include factors representing the amount of heat generated from the device under measurement and the amount of heat removed in the cooling step. Alternatively, the temperatures of the neighboring devices may be predicted on the basis of experimental data.

The device inspecting method further may comprise a temperature predicting step. In this step, the temperatures of the devices formed on the semiconductor wafer are predicted at the end of the inspecting step on the basis of prediction factors including the factors representing the amount of heat generated from the device under measurement and the amount of heat removed in the cooling step. Based on this temperature prediction, the devices satisfying the predetermined temperature conditions are selected from among the devices that are not inspected. The contact elements are brought into contact with the electrodes of at least one device included among the selected devices.

The device inspecting method further may comprise a step of enabling the devices formed on the semiconductor wafer to be inspected in the shortest period of time.

According to another aspect of this invention there is provided a device inspecting apparatus that comprises: a main chuck on which a semiconductor wafer having devices formed thereon is held; contact elements which are brought into contact with the electrodes of at least one device that is included among the devices on the semiconductor wafer and which output measurement results; selecting means for selecting at least one device which is not inspected and satisfies temperature conditions predetermined for inspection, from among the devices formed on the semiconductor wafer; contact means for bringing the contact elements into contact with the electrodes of the selected at least one device; and measuring means, electrically connected to the contact elements, for measuring the electric characteristics of the devices on the basis of the measuring results output from the contact elements.

In the invention described in each of the claims, the contact means may be any type as long as it can bring the contact elements into accurate contact with the electrodes of the selected device or devices. In a preferred embodiment, the contact means is a mechanism for controlling the driving mechanism that moves the main chuck in the X-, Y-, Z- and θ-directions, on the basis of the positional information on the selected device or devices. Alternatively, the contact means may be a mechanism capable of moving the contact elements on the basis of the positional information on the selected device or devices.

The selecting means may identify those devices which are not inspected and satisfy the predetermined temperature conditions, and selects at least one device from among the identified devices.

According to another aspect of this invention there is provided a device inspecting apparatus that comprises: a main chuck on which a semiconductor wafer having devices formed thereon is held; contact elements which are brought into contact with the electrodes of one device that is included among the devices formed on the semiconductor wafer and which output measurement results; selecting means for selecting one device which is not inspected and satisfies temperature conditions predetermined for inspection, from among the devices formed on the semiconductor wafer; contact means for bringing the contact elements into contact with the electrodes of the selected device; and measuring means, electrically connected to the contact elements, for measuring the electric characteristics of the devices on the basis of the measuring results output from the contact elements.

The selecting means may identify those devices which are not inspected and satisfy the predetermined temperature conditions, and selects one device from among the identified devices.

The device inspecting apparatus further may comprise cooling means for cooling the devices to a temperature lower than ordinary temperature.

The selecting means may predict the temperatures of the devices formed on the semiconductor wafer when the selected at least one device is inspected, and on the basis of the temperature prediction selects at least one device from among those devices which are not inspected and satisfy the temperature conditions.

When the selected at least one device is inspected, the selecting means may predict the temperatures of the devices formed on the semiconductor wafer on the basis of prediction factors including the factors representing the amount of heat generated from the device under measurement and the amount of heat removed in the cooling step, and, based on this temperature prediction, selects at least one device from among those devices which are not inspected and which satisfy the predetermined temperature conditions.

The selecting means may selects at least one device such that the devices formed on the semiconductor wafer can be inspected in the shortest period of time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the above description of the background art, the conventional inspecting apparatus was explained as comprising: a cassette mount section; a loader section provided with a subchuck; a prober section provided with a main chuck, an alignment mechanism and a probe card; and a test section.

The present invention is not limited to such a type of inspecting apparatus as described above and can be embodied as an inspecting method and apparatus of any type that is designed to measure the devices formed on a wafer. In the description below, reference will be made, as a preferred embodiment, to the case where the present invention is applied to such a type of inspecting apparatus as was explained above as an example of the conventional device.

Figure 1:
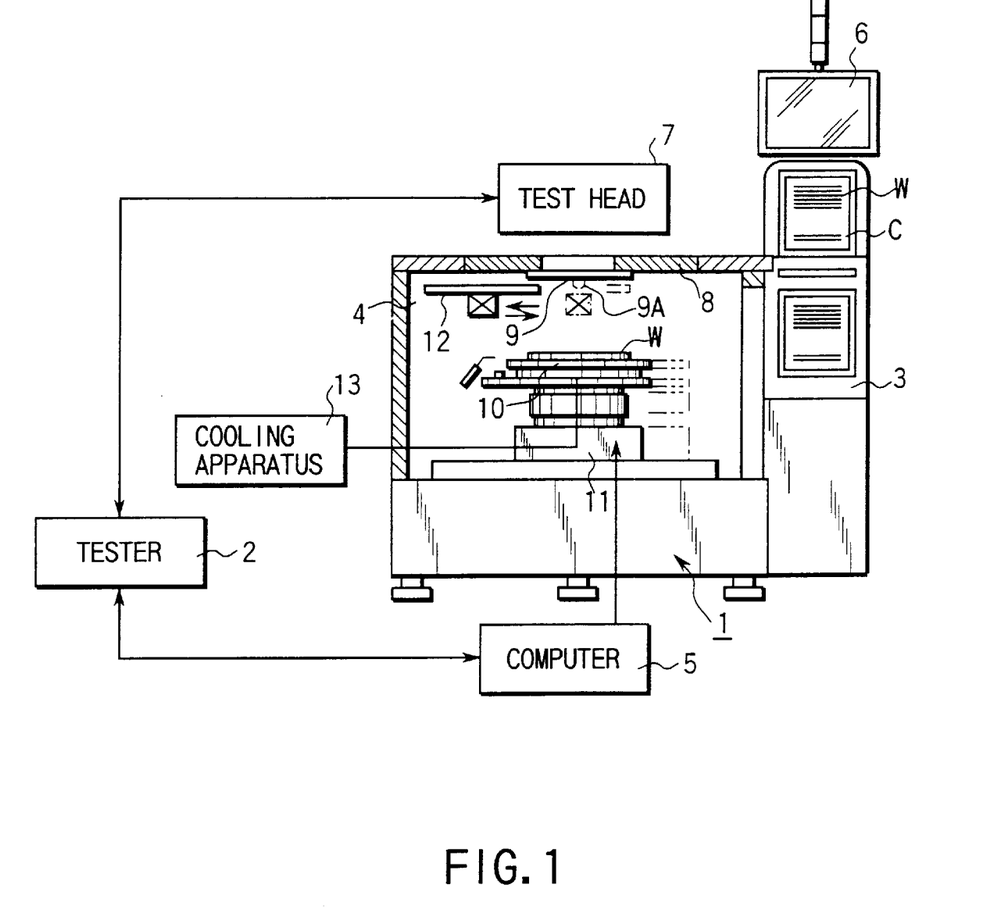
FIG. 1 shows an inspecting apparatus according to one embodiment of the present invention.

Referring to FIG. 1, an inspecting apparatus 1 comprises a loader section 3, a main chuck 10, a prober section 4 and a tester 2. The inspecting apparatus 1 also comprises a computer 5 for controlling the loader section 3 and the prober section 4. The inspecting apparatus 1 further comprises a display device 6 that also serves as an operating panel used for operating the computer 5.

The loader section 3 is a section where the wafer W contained in a cassette C is conveyed. The loader section 3 is provided with a subchuck (not shown) for pre-aligning the wafer W, using its orientation flat as a reference. The wafer W is pre-aligned when it is conveyed from the loader section 3 to the prober section 4.

The prober section 4 is a section where the electric characteristics of the wafer W conveyed from the loader section 3 are measured. The prober section 4 is provided with a main chuck 10 for sucking the wafer by vacuum and placing it onto a predetermined portion, a driving mechanism 11 for moving the main chuck 10 in X-, Y-, Z- and θ-directions, and an alignment mechanism 12 for positioning the wafer W sucked by the main chuck 10 with reference to the contact elements (probes) 9A of an inspection card 9. By the alignment mechanism 12 and the driving mechanism 11, the electrode pads of the devices formed on the wafer W held on the main chuck 10 are positioned with reference to the probes 9A of the inspection card 9, in such a manner that the electrode pads are electrically connected to the probes 9A. The prober section 4 is provided with a cooling apparatus 13. The cooling apparatus 13 circulates a refrigerant (e.g., ethylene glycol) through the refrigerant path formed inside the main chuck, so as to cool the wafer W held on the wafer W. When the electric characteristics of the devices have to be measured, with the wafer W kept cool, as in the case where the devices have to be measured at a temperature lower than the ordinary temperature or in the case where heat-generating devices are measured, the wafer W held on the main chuck 10 is cooled by the cooling apparatus 13 in the manner mentioned above.

The tester 2 is provided with a test head 7. During inspection, the test head 7 is kept in electric contact with the inspection card 9 attached to the head plate 8 of the prober section 4. At the time of maintenance, the test head 7 is turned away from the inspection card 9 and moved to a position remote from the prober section 4.

Figure 2:
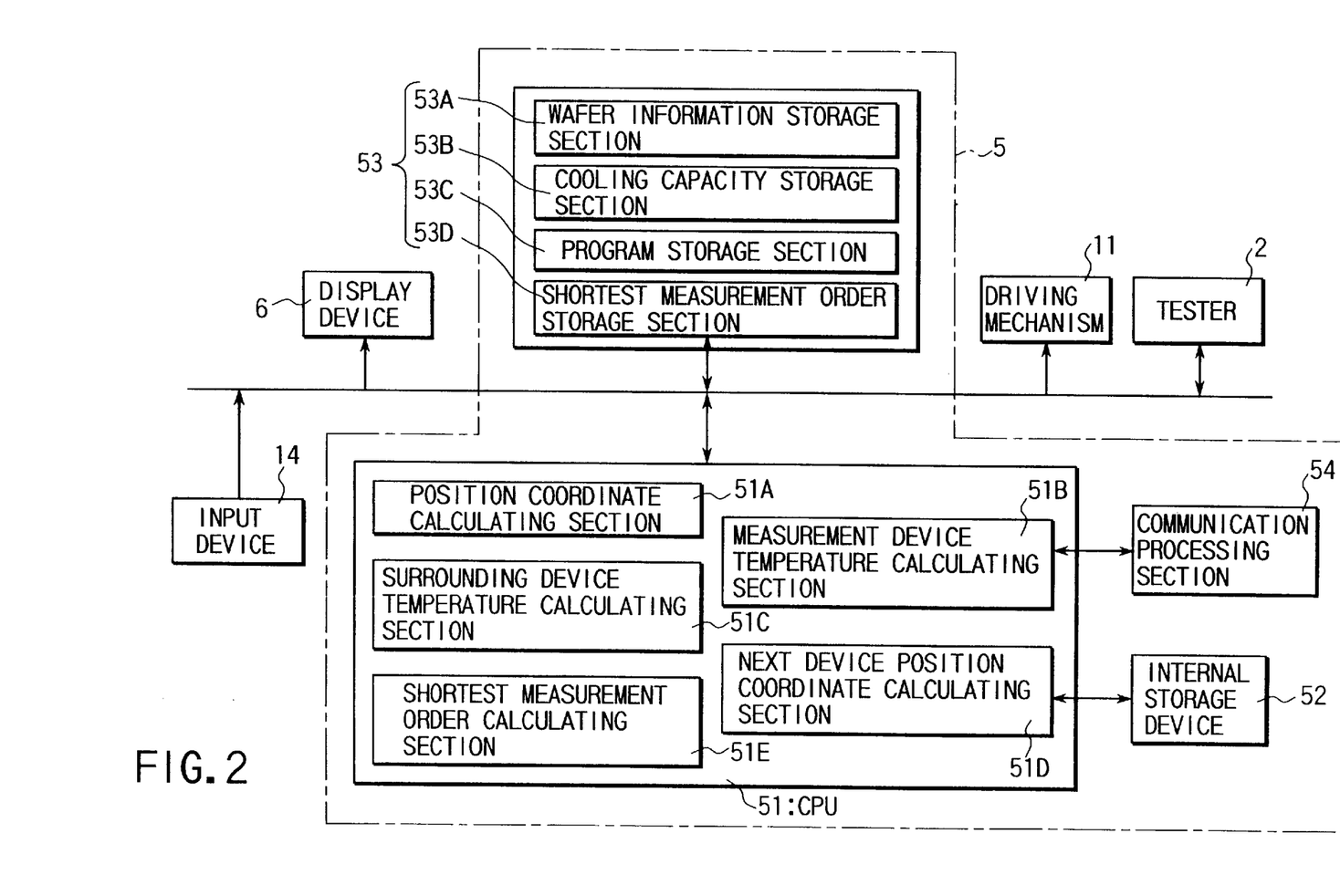
FIG. 2 is a block diagram which mainly shows the computer employed in the inspecting apparatus.

As shown in FIG. 2, the computer 5 is provided with a central processing unit (hereinafter referred to as a CPU) 51, an internal storage device 52, an external storage device 53 and a communication processing section 54. The external storage device 53 includes a wafer information storage area 53A for storing data on a variety types of wafers as wafer information, a cooling capacity storage section 53B for storing data on the cooling capacity, a program storage section 53C for storing a program that controls the inspecting apparatus 1, and a shortest measurement order storage section 53D. The wafer information includes data on the diameter of a wafer, the X- and Y-directional dimensions and thickness of a device (hereinafter referred to as a device size), the amount of heat generated by the device, the standard measurement time required for the measurement of the device, the temperature at which the device can be measured, etc. An input device 14, such as a keyboard, is connected to the computer 5, and the wafer information and the data on the cooling capacity are entered from the input device 14.

The CPU 51 is provided with a system for simulating the temperatures of devices that are located in the vicinity of the device under measurement. The simulating system includes the following: a position coordinate calculating section 51A for calculating the position coordinates of all devices that correspond to a designated type, on the basis of the corresponding wafer information; a measurement device temperature calculating section 51B for calculating the surface temperature of the device under measurement, on the basis of the cooling capacity and the wafer information (incl. data on the measurement time, data on the amount of heat generated, data on the chip size, etc.) regarding the devices detected by the calculation by calculating section 51A; a surrounding device temperature calculating section 51C for calculating the surface temperatures of the devices located in the vicinity of the device under measurement, on the basis of the cooling capacity and the results of the calculation performed by calculating section 51B; a next device position coordinate calculating section 51D for calculating the position coordinates of devices the temperature of which are suitable for measurement and which are to be measured next (such devices will be hereinafter referred to as next-measurement devices), on the basis of the results of the calculation performed by calculating section 51C; and a shortest measurement order calculating section 51E for successively calculating the distances from the device under measurement to all next-measurement devices detected by calculating section 51D, for determining a plurality of measurement routes along which measurement is performed from the presently-measured device to the last one of the next-measurement devices and calculating the measurement times corresponding to the measurement routes, and for calculating the total measurement time and determining the shortest measurement route that enables the total measurement time to be shortest.

When the CPU 51 is actuated, a predetermined program is read out from the program storage section 53C of the external storage section 53. The readout program is temporarily stored in the internal storage device 52, and the CPU 51 operates according to this program. First of all, the wafer information is transferred from the wafer information storage section 53A to the internal storage device 52. In addition, the data on the cooling capacity is transferred from the cooling capacity storage section 53B to the internal storage section 52. Then, calculations are performed by the calculating sections 51A to 51E, and the shortest route for measurement is determined by the CPU 51. Under the control of the CPU 51, the data on the shortest measurement route is supplied to the shortest measurement order storage section 53D of the external storage device 53 and is stored there. It should be noted that a number of next-measurement devices exist with reference to a device that is being measured. When one of the next-measurement devices is selected and measured, a number of next-measurement devices also exit with reference to that device. Therefore, when the next-measurement device is selected from a number of possible ones, the number of measurement routes which can be selected increases progressively from the number of devices which can be measured first of all. This means that the number of possible measurement routes will be very large. When the shortest measurement route is determined, therefore, those devices which are not located in the measurement direction are excluded from the next-measurement devices. In this manner, all next-measurement devices from the device under measurement are determined in consideration of the measurement direction, and moving distances are calculated with respect to all of them.

Each time the moving distances are obtained, they are compared with one another, and the shortest one is selected. By sequentially selecting this shortest distance, the shortest measurement route is determined.

The computer 5 of the inspecting apparatus 1 calculates the shortest measurement route on the basis of the wafer information of a wafer W when the type of that wafer W is designated. Based on this shortest measurement route, the computer 5 sequentially supplies the positional coordinates of the devices to be measured to the tester by way of the communication processing section 54. The tester performs measurement on the basis of the positional coordinates until all devices are measured.

Although not shown, the computer of the inspecting apparatus comprises a circuit for transmitting a measurement start enable signal to the tester 2, a circuit for transmitting positional coordinates of the presently-measured device to the tester 2, etc. Likewise, the tester comprises a circuit for transmitting a measurement start instruction signal to the computer 5 on the basis of the measurement start enable signal, a circuit for recognizing the positional coordinates of the presently-measured device on the basis of a signal supplied from the positional coordinate transmitting circuit, a measuring circuit for measuring a device, a processing circuit for processing the results of measurement, etc.

An embodiment of the inspecting method of the present invention using the inspecting apparatus mentioned above will be described with reference to the flowcharts shown in FIGS. 3 and 4.

The wafer inspection includes pre-processing (FIG. 3) for determining the shortest measurement route on the wafer W by use of the computer 5; and measurement processing (FIG. 4) for inspecting the wafer W along the shortest measurement route determined in the pre-processing.

Figure 3:
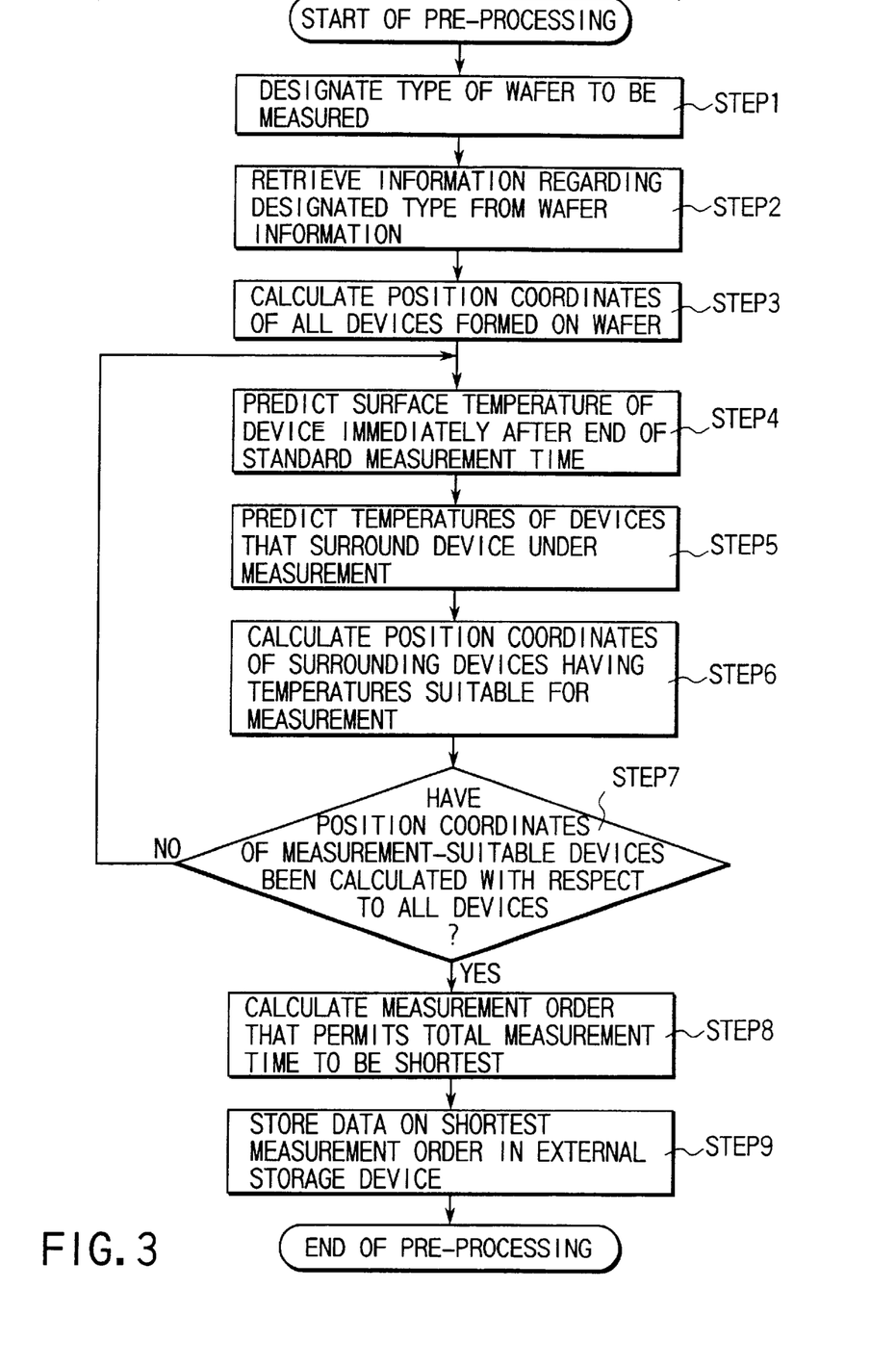
FIG. 3 is a flowchart according to which the measurement route of devices is determined.
Figure 4:
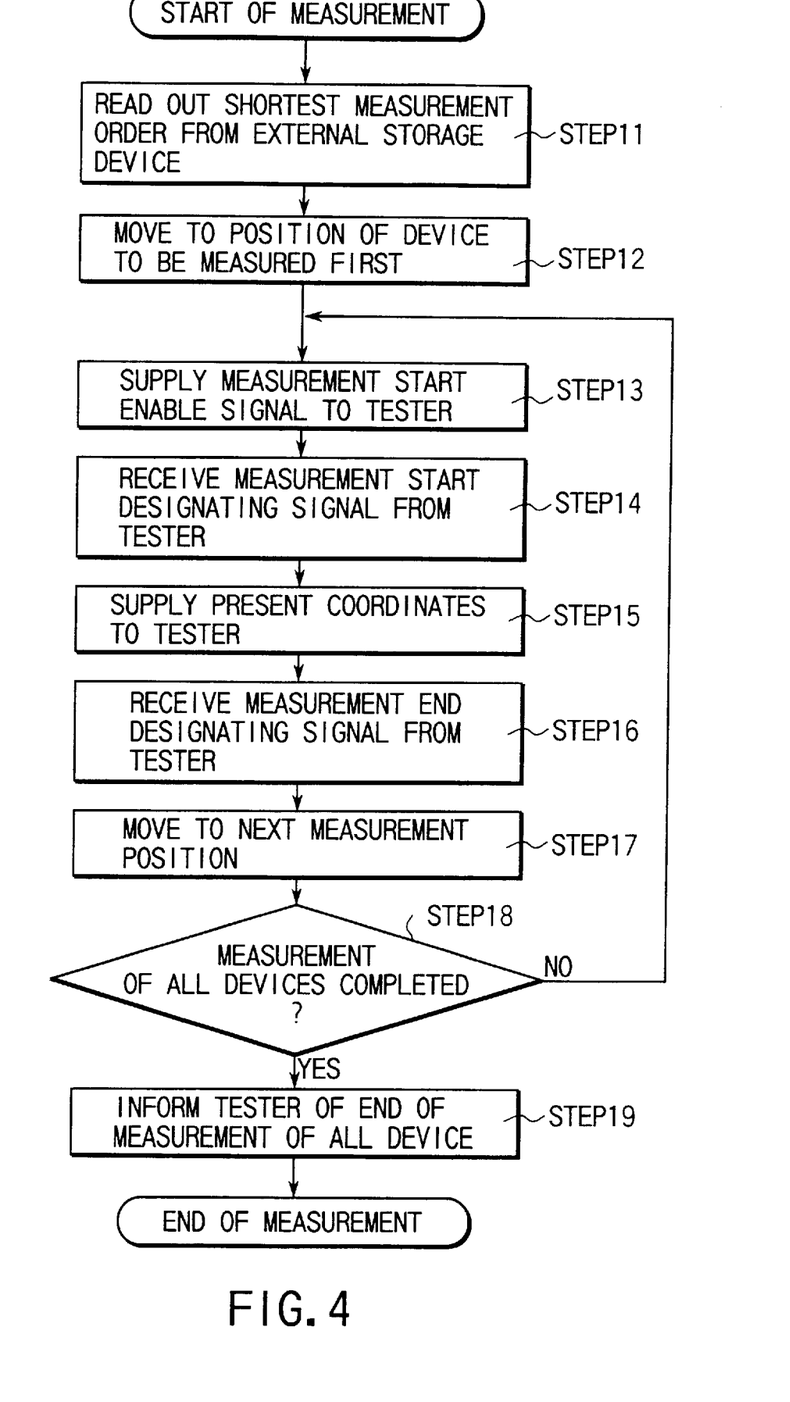
FIG. 4 is a flowchart showing how the inspection using the inspecting apparatus of FIG. 1 is executed.

Referring to FIG. 3, the pre-processing starts with step 1. In this step, the type of a wafer W to be measured is designated from the operating panel (i.e., the display device 6) or the input device 14. Subsequently, step 2 is carried out, wherein the CPU 51 operates in accordance with the predetermined program, and the wafer information regarding the designated type is retrieved from the wafer information storage section 53A of the external storage device 53. In step 3, the position coordinates of all devices formed on the designated wafer are calculated by the position coordinate calculating section 51A and stored in the internal storage device 52.

In step 4, the surface temperature of the initially measured device (e.g., the device located in the first column of the first row) is predicted immediately after the end of the standard measurement time. This temperature prediction is performed by the measurement device temperature calculating section 51B on the basis of the data read out from the wafer information storage section 53A and representing the chip size, the amount of heat generated, etc. and the data read out from the cooling capacity storage section 53B. In step 5, the surface temperatures of the devices located in the neighborhood of the device under measurement are predicted or simulated by the surrounding device temperature calculating section 51C in light of the conduction characteristics of the wafer, by performing calculation as in step 4. In step 6, the position coordinates of the next-measurement devices whose temperatures are suitable for measurement are calculated by the next device position coordinate calculating section 51D by checking the surface temperatures predicted in step 5.

In step 7, the next-measurement devices are sequentially determined with respect to each of the devices under measurement, and then a check is made to see whether or not the position coordinates of next-measurement devices (the temperatures of which are suitable for measurement) have been calculated with respect to all devices under measurement. If the check shows that the position coordinates have not yet been calculated with respect to all of the devices under measurement, then steps 4–6 are repeated. If the check shows that the position coordinates have been calculated with respect to all of the devices under measurement, step 8 is executed. In this step, the measurement routes along which measurement is first performed from the initially measured device to the last one of the next-measurement devices are first determined, and then the shortest route is selected from among the determined measurement routes by the shortest measurement order calculating section 51E. In step 9, data on the shortest measurement route is supplied to the shortest measurement order storage section 53D of the external storage device 53 and is stored therein. In this manner, the pre-processing is performed.

Next, the measurement processing is executed. As shown in FIG. 4, the measurement processing is started with step 11. In this step, data on the shortest measurement route is read out from the shortest measurement order storage section 53D under the control of the CPU 51. In step 12, the main chuck 10 is moved to the position corresponding to the initially measured device. In step 13, a measurement start enable signal is supplied from the inspecting apparatus 1 to the tester 2. Upon reception of this signal, the tester 2 supplies a measurement start designating signal to the inspecting apparatus 1 and is received thereby in step 14. In step 15, the present coordinates of the device from which measurement is started are supplied from the inspecting device 1 to the tester 2. In step 16, the tester 2 measures the device and supplies a measurement end designating signal to the inspecting apparatus 1. In step 17, the main chuck 10 is moved to the position corresponding to the device to be subsequently measured. In step 18, a check is made to see whether or not all devices have been measured. If the check does not show that all devices have been measured, steps 13–17 are repeated. If the check in step 18 shows that all devices have been measured, the inspecting apparatus 1 informs the tester 2 of this, and the measurement is brought to an end.

In the embodiment described above, those devices which satisfy the temperature conditions suitable for the next measurement are identified at the end of each inspecting process, and this identification is based on the temperature prediction that uses prediction factors representing the amount of heat generated from the device under measurement, the amount of heat removed in the cooling step, etc.

The method for identifying devices is in no way limited to this. For example, the devices which are suitable for next measurement can be identified by temperature prediction based on the results of an experiment executed beforehand. This alternative method will be described with reference to FIGS. 7A and 7B. After the measurement of the device D shown in FIG. 7A is started, the temperature of the device D gradually increases, as shown in FIG. 7B. In accordance with this, the temperatures of neighboring devices ① and ① also increase. At the end of the measurement of device D, the temperature of device ① exceeds the upper limit of the measurement start temperature range, so that the measurement of device ① cannot be started. On the other hand, the temperature of device ② is within the measurement start temperature range, and the measurement of device ② can be started. In this manner, the temperature of each device on the semiconductor wafer can be measured beforehand, and data obtained thereby can be used for identifying devices that satisfy the predetermined temperature conditions.

Figure 5:
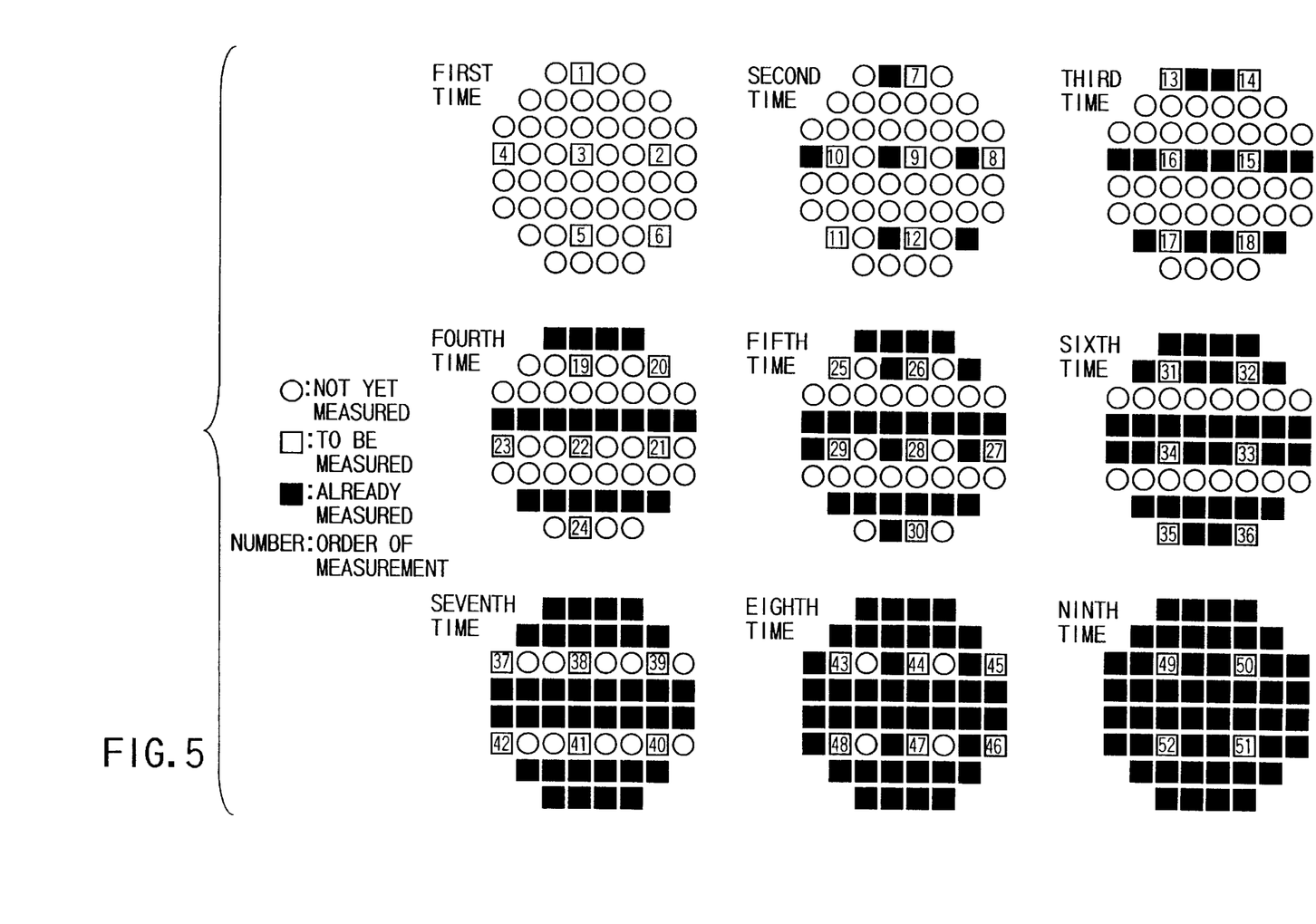
FIG. 5 is a schematic view of the measuring route along which the devices on a wafer are measured.

FIG. 5 shows an example of a manner in which to identify semiconductor integrated circuits that satisfy the temperature conditions predetermined for next inspection. In the example shown in FIG. 5, every third device is measured, and the main chuck makes nine revolutions over the wafer W so as to measure all devices. During the first revolution, the device indicated by numeral 1 enclosed within a box (□) is measured first of all, and then the main chuck is moved to the position corresponding to the device which is the second one from the right in the fourth row since this device is not much influenced by the heat generated from the device under measurement and the temperature thereof is suitable for measurement. Thereafter, the main chuck is moved rightward, and every third device is measured in the order indicated in the numerals enclosed with the boxes. Then, the main chuck is switched in moving direction, and the devices indicated by numerals 5 and 6 enclosed within the boxes are measured. During the second revolution of the main chuck, the device located on the right side of the initially-measured device is measured, then the main chuck is moved and changed in moving direction in the same way as that of the first revolution, and every third device is measured. In the illustration of the second revolution of the main chuck, the devices indicated by black boxes (■) are devices that are measured during the first revolution of the main chuck. During the third revolution, the device located on the left side of the initially-measured device is measured first of all, and the measurement is continued while moving the main chuck and changing its moving direction in the same manner as in the first revolution. Since the devices in the first row are measured at the end of the third revolution, the starting point of the fourth revolution is the third device from the left in the second row, and measurement is started from that device. In this manner, measurement is continued until the main chuck makes nine revolutions and all devices are measured.

As described above, according to the embodiment, even if the heat generated by a device under measurement is transmitted to the neighboring devices by thermal conduction, and the temperatures of the neighboring devices become higher than the upper limit of the measurement start temperature range, the main chuck is moved to a next-measurement device (the temperature of which is within the measurement start temperature range). Since such a device can be selected immediately after the end of the measurement or shortly thereafter, it is not necessary to wait for a long time until the temperatures of the neighboring devices fall within the measurement start temperature range. Accordingly, all devices can be measured efficiently and reliably without any loss of time, and the inspection efficiency can be remarkably enhanced. The inspection efficiency can be further enhanced when the main chuck is moved in such a manner as to permit the measurement route to be shortest.

The embodiment mentioned above in no way restricts the present invention. That is, the present invention can be reduced to practice in cases where the heat generated from a device under measurement increases the temperatures of the neighboring devices. Moreover, the use of the cooling apparatus is not essential to the present invention, though in the above-mentioned embodiment measurement is performed while simultaneously cooling the wafer by use of the cooling apparatus.

The present invention can provide an inspecting method and apparatus which ensure efficient and reliable measurement and remarkably enhance the inspecting efficiency. Even when a device that generates heat is measured, it is not necessary to wait for a long time until the temperatures of the surrounding devices decrease. The present invention can also provide an inspecting method and apparatus which enable efficient inspection to be performed in the shortest possible time by measuring devices while simultaneously cooling the semiconductor wafer.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor integrated circuit inspecting method comprising:

a contact step of bringing contact elements into contact with electrodes of at least one semiconductor integrated circuit selected from semiconductor integrated circuits that are formed on a semiconductor wafer and causing measurement results to be output from the contact elements; and an inspecting step of measuring electric characteristics of the selected at least one semiconductor integrated circuit based on the measurement results output from the contact elements, said contact step and said inspecting step being sequentially executed with respect to each of the semiconductor integrated circuits formed on the semiconductor wafer, said contact step including a sub-step of selecting at least one semiconductor integrated circuit which remains unchecked and satisfies predetermined temperature conditions from among the semiconductor integrated circuits formed on the semiconductor wafer and a sub-step of bringing the contact elements into contact with the electrodes of the selected at least one semiconductor integrated circuit.

2. A semiconductor integrated circuit inspecting method according to claim 1, wherein said contact step includes a sub-step of checking the semiconductor integrated circuits formed on the semiconductor wafer to select those semiconductor integrated circuits which remain uninspected and which satisfy the predetermined temperature conditions, and a sub-step of bringing the contact elements into contact with the electrodes of at least one semiconductor integrated circuit included among the selected semiconductor integrated circuits.

3. A semiconductor integrated circuit inspecting method according to claim 2, further comprising a cooling step for cooling the semiconductor integrated circuits to a temperature lower than ordinary temperature.

4. A semiconductor integrated circuit inspecting method according to claim 3, further comprising:

a pre-processing step of predicting the temperature of the semiconductor integrated circuits formed on the semiconductor wafer when the inspecting step comes to an end, wherein the sub-step of selecting further comprises selecting those semiconductor integrated circuits which remain uninspected and satisfy the predetermined temperature conditions based on results of said pre-processing step, and the sub-step of bringing further comprises bringing into contact the contact elements with the electrodes of at least one semiconductor integrated circuit included among the selected semiconductor integrated circuits.

5. A semiconductor integrated circuit inspecting method according to claim 3, further comprising:

a temperature predicting step of predicting the temperatures of the semiconductor integrated circuits formed on the semiconductor wafer when the inspecting step comes to an end, said temperature predicting step being executed based on prediction factors including factors representing the amount of heat generated from the semiconductor integrated circuit under measurement and the amount of heat removed in the cooling step, semiconductor integrated circuits satisfying the predetermined temperature conditions being selected from among the semiconductor integrated circuits that remain uninspected, based on the temperature predicting step, and the contact elements being brought into contact with the electrodes of at least one semiconductor integrated circuit included among the selected semiconductor integrated circuits.

6. A semiconductor integrated circuit inspecting method according to any one of claims 1 through 5, wherein the sub-steps included in the contact step enable the semiconductor integrated circuits formed on the semiconductor wafer to be inspected within a minimum length of time.

7. A semiconductor integrated circuit inspecting method comprising:

a contact step of bringing contact elements into contact with electrodes of one semiconductor integrated circuit selected from semiconductor integrated circuits that are formed on a semiconductor wafer and causing measurement results to be output from the contact elements; and an inspecting step of measuring electric characteristics of the selected one semiconductor integrated circuit on the basis of the measurement results output from the contact elements, said contact step and said inspecting step being sequentially executed with respect to each of the semiconductor integrated circuits formed on the semiconductor wafer, said contact step including a sub-step of selecting one semiconductor integrated circuit which remains unchecked and satisfies predetermined temperature conditions from among the semiconductor integrated circuits formed on the semiconductor wafer and a sub-step of bringing the contact elements into contact with the electrodes of the selected semiconductor integrated circuit.

8. A semiconductor integrated circuit inspecting method according to claim 7, wherein said contact step includes a sub-step of checking the semiconductor integrated circuits formed on the semiconductor wafer to select those semiconductor integrated circuits which remain uninspected and which satisfy the predetermined temperature conditions, and a sub-step of bringing the contact elements into contact with the electrodes of one semiconductor integrated circuit included among the selected semiconductor integrated circuits.

9. A semiconductor integrated circuit inspecting method according to claim 8, further comprising a cooling step for cooling the semiconductor integrated circuits to a temperature lower than ordinary temperature.

10. A semiconductor integrated circuit inspecting method according to claim 9, further comprising:
a pre-processing step of predicting the temperatures of the semiconductor integrated circuits formed on the semiconductor wafer when the inspecting step comes to an end, wherein
the sub-step of selecting further comprises selecting those semiconductor integrated circuits which remain uninspected and satisfy the predetermined temperature conditions based on results of said pre-processing step, and the sub-step of bringing further comprises bringing into contact the contact elements with the electrodes of one semiconductor integrated circuit included among the selected semiconductor integrated circuits.

11. A semiconductor integrated circuit inspecting method according to claim 9, further comprising:
a temperature predicting step of predicting the temperatures of the semiconductor integrated circuits formed on the semiconductor wafer when the inspecting step comes to an end, said temperature predicting step being executed based on prediction factors including factors representing the amount of heat generated from the semiconductor integrated circuit under measurement and the amount of heat removed in the cooling step,
semiconductor integrated circuits satisfying the predetermined temperature conditions being selected based on the temperature predicting step from among the semiconductor integrated circuits that remain uninspected, and the contact elements being brought into contact with the electrodes of one semiconductor integrated circuit included among the selected semiconductor integrated circuits.

12. A semiconductor integrated circuit inspecting method according to any one of claims 7 through 11, wherein the sub-steps included in the contact step enable the semiconductor integrated circuits formed on the semiconductor wafer to be inspected within a minimum length of time.

13. A semiconductor integrated circuit inspecting apparatus comprising:
a main chuck on which a semiconductor wafer having semiconductor integrated circuits formed thereon is held;
contact elements which are brought into contact with electrodes of at least one semiconductor integrated circuit that is included among the semiconductor integrated circuits on the semiconductor wafer and which output measurement results;

selecting means for selecting at least one semiconductor integrated circuit which remains uninspected and satisfies temperature conditions predetermined for inspection, from among the semiconductor integrated circuits formed on the semiconductor wafer;
contact means for bringing the contact elements into contact with the electrodes of the selected at least one semiconductor integrated circuit; and
measuring means, electrically connected to the contact elements, for measuring electric characteristics of the semiconductor integrated circuits on the basis of the measuring results output from the contact elements.

14. A semiconductor integrated circuit inspecting apparatus according to claim 13, wherein said selecting means identifies those semiconductor integrated circuits which remain uninspected and which satisfy the predetermined temperature conditions, and selects at least one semiconductor integrated circuit from among the identified semiconductor integrated circuits.

15. A semiconductor integrated circuit inspecting apparatus according to claim 14, further comprising:
cooling means for cooling the semiconductor integrated circuits to a temperature lower than ordinary temperature.

16. A semiconductor integrated circuit inspecting apparatus according to claim 15, wherein said selecting means predicts the temperatures of the semiconductor integrated circuits formed on the semiconductor wafer and, based on temperature prediction, selects at least one semiconductor integrated circuit from among those semiconductor integrated circuits which remain uninspected and satisfy the temperature conditions.

17. A semiconductor integrated circuit inspecting apparatus according to claim 15, wherein said selecting means predicts the temperatures of the semiconductor integrated circuits formed on the semiconductor wafer on the basis of prediction factors including factors representing the amount of heat generated from the semiconductor integrated circuit under measurement and the amount of heat removed in the cooling step, and, based on temperature prediction, selects at least one semiconductor integrated circuit from among those semiconductor integrated circuits which remain uninspected and which satisfy the predetermined temperature conditions.

18. A semiconductor integrated circuit inspecting apparatus according to any one of claims 13–17, wherein said selecting means selects at least one semiconductor integrated circuit such that the semiconductor integrated circuits formed on the semiconductor wafer can be inspected within a minimum length of time.

19. A semiconductor integrated circuit inspecting apparatus comprising:
a main chuck on which a semiconductor wafer having semiconductor integrated circuits formed thereon is held;
contact elements which are brought into contact with the electrodes of one semiconductor integrated circuit that is included among the semiconductor integrated circuits formed on the semiconductor wafer and which output measurement results;
selecting means for selecting one semiconductor integrated circuit which remains uninspected and satisfies temperature conditions predetermined for inspection, from among the semiconductor integrated circuits formed on the semiconductor wafer;
contact means for bringing the contact elements into contact with the electrodes of the selected semiconductor integrated circuit; and measuring means, electrically connected to the contact elements, for measuring electric characteristics of the semiconductor integrated circuits based on the measuring results output from the contact elements.

20. A semiconductor integrated circuit inspecting apparatus according to claim 19, wherein said selecting means identifies those semiconductor integrated circuits which remain uninspected and which satisfy the predetermined temperature conditions, and selects one semiconductor integrated circuit from among the identified semiconductor integrated circuits.

21. A semiconductor integrated circuit inspecting apparatus according to claim 20, further comprising:

cooling means for cooling the semiconductor integrated circuits to a temperature lower than ordinary temperature.

22. A semiconductor integrated circuit inspecting apparatus according to claim 21, wherein said selecting means predicts the temperatures of the semiconductor integrated circuits formed on the semiconductor wafer and, based on temperature prediction, selects one semiconductor integrated circuit from among those semiconductor integrated circuits which remain uninspected and satisfy the temperature conditions.

23. A semiconductor integrated circuit inspecting apparatus according to claim 21, wherein said selecting means predicts the temperatures of the semiconductor integrated circuits formed on the semiconductor wafer on the basis of prediction factors including factors representing the amount of heat generated from the semiconductor integrated circuit under measurement and the amount of heat removed in the cooling step, and, based on temperature prediction, selects one semiconductor integrated circuit from among those semiconductor integrated circuits which remain uninspected and which satisfy the predetermined temperature conditions.

24. A semiconductor integrated circuit inspecting apparatus according to any one of claims 19–23, wherein said selecting means selects one semiconductor integrated circuit such that the semiconductor integrated circuits formed on the semiconductor wafer can be inspected within a minimum length of time.

* * * * *